(12) United States Patent
Kim

(10) Patent No.: US 8,198,171 B2
(45) Date of Patent: Jun. 12, 2012

(54) SEMICONDUCTOR DEVICE AND FABRICATION METHOD THEREOF

(75) Inventor: Hyung-Hwan Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 218 days.

(21) Appl. No.: 12/640,118

(22) Filed: Dec. 17, 2009

(65) Prior Publication Data

US 2011/0101488 A1    May 5, 2011

(30) Foreign Application Priority Data

Oct. 30, 2009  (KR) .................. 10-2009-0104688

(51) Int. Cl.
*H01L 21/76* (2006.01)

(52) U.S. Cl. ........ 438/427; 438/435; 438/437; 438/221; 438/219; 257/506; 257/E29.02; 257/E21.546; 257/E21.548

(58) Field of Classification Search .................. 438/427, 438/435, 437, 221, 219; 257/506, E29.02, 257/E21.546, E21.548
See application file for complete search history.

(56) References Cited

U.S. PATENT DOCUMENTS 6,146,970 A * 11/2000 Witek et al. .................. 438/424
2002/0197823 A1 * 12/2002 Yoo et al. ...................... 438/424

FOREIGN PATENT DOCUMENTS

| JP | 2008-091368 | 4/2008 |
| KR | 1020080114065 | 12/2008 |
| KR | 1020090045668 | 5/2009 |
| KR | 1020090087643 | 8/2009 |

OTHER PUBLICATIONS

Notice of Allowance issued from Korean Intellectual Property Office on Jun. 29, 2011.

* cited by examiner

*Primary Examiner* — Tu-Tu Ho
(74) *Attorney, Agent, or Firm* — IP & T Group LLP

(57) ABSTRACT

A method for fabricating a semiconductor device includes: providing a substrate; forming a plurality of trenches by etching the substrate; forming a first isolation layer by filling the plurality of the trenches with a first insulation layer; recessing the first insulation layer filling a first group of the plurality of the trenches to a predetermined depth; forming a liner layer over the first group of the trenches with the first insulation layer recessed to the predetermined depth; and forming a second isolation layer by filling the first group of the trenches, where the liner layer is formed, with a second insulation layer.

9 Claims, 4 Drawing Sheets

US 8,198,171 B2

SEMICONDUCTOR DEVICE AND FABRICATION METHOD THEREOF

CROSS-REFERENCE TO RELATED APPLICATIONS

The present application claims priority of Korean Patent Application No. 10-2009-0104688, filed on Oct. 30, 2009, which is incorporated herein by reference in its entirety.

BACKGROUND OF THE INVENTION

Exemplary embodiments of the present invention relate to a semiconductor device and a fabrication method thereof, and more particularly, to a semiconductor device including an isolation layer, and a method for forming an isolation layer of a semiconductor device.

A semiconductor device includes an isolation layer for isolating devices one from another. As semiconductor devices become highly integrated, a conventional LOCal Oxidation of Silicon (LOCOS) process for forming an isolation layer is reaching its limits. Therefore, a method of forming an isolation layer using a shallow trench isolation (STI) process is being used instead.

Hereafter, a conventional method of forming an isolation layer of a semiconductor device will be described with reference to the accompanying drawings.

FIGS. 1A to 1D are cross-sectional views illustrating a conventional method of forming an isolation layer of a semiconductor device. Referring to FIG. 1A, a substrate 10 including a cell region CELL and a peripheral region PERI is provided. The peripheral region includes a PMOS region, where a PMOS transistor is to be formed, and an NMOS region, where an NMOS transistor is to be formed.

Subsequently, after a pad oxide layer 11 and a pad nitride layer 12 are sequentially formed over the substrate 10, the pad nitride layer 12 and the pad oxide layer 11 are etched, and the substrate 10 is etched to a predetermined depth to form a plurality of trenches for device isolation.

Subsequently, an oxidation process is performed to cure the damage on the substrate caused during the etch process for forming the trenches for device isolation. Through the oxidation process, a sidewall oxide layer 13 is formed on the surface of the substrate 10 exposed on the internal wall and the bottom of the plurality of the trenches for device isolation.

Subsequently, a liner nitride layer 14 and a liner oxide layer 15 are sequentially formed over the substrate 10 with the sidewall oxide layer 13 formed therein. The liner nitride layer 14 and the liner oxide layer 15 are simultaneously formed in the cell region and the peripheral region. In particular, since the liner nitride layer 14 and the liner oxide layer 15 are formed over the trenches for device isolation of the cell region and the peripheral region, isolation layers disposed in the cell region and the peripheral region include the liner nitride layer 14 and the liner oxide layer 15.

With the liner oxide layer 15 formed, a first insulation layer may be deposited in a subsequent process with increased efficiency. Also, with the liner nitride layer 14, it is possible to reduce the stress applied to the substrate 10 and prevent impurities of an isolation layer from being diffused into the substrate 10 in a subsequent thermal treatment. Therefore, the refresh characteristics of a semiconductor device can be improved.

In case of the liner nitride layer 14 formed in the PMOS region, however, hot electrons are trapped to induce attraction to holes. Therefore, holes are accumulated on the internal wall of the trenches for device isolation to decrease the width of a channel, and accordingly, a hot electron-induced punch through (HEIP) phenomenon is caused. As a result, current leaks out of a source/drain of a PMOS transistor.

Therefore, a process for selectively removing the liner nitride layer 14 formed over the PMOS region is subsequently performed.

Referring to FIG. 1B, a photoresist is applied to the substrate 10 with the liner nitride layer 14 and the liner oxide layer 15 formed therein. A photoresist pattern 16 is formed to open the PMOS region, while covering the cell region and the NMOS region through an exposure and development process.

Subsequently, the liner oxide layer 15, exposed in the PMOS region, is removed using the photoresist pattern 16 as an etch barrier. As a result, the liner nitride layer 14 the PMOS region is exposed.

Referring to FIG. 1C, after the photoresist pattern 16 is removed, the liner nitride layer 14 of the PMOS region is removed using the liner oxide layer 15 of an NMOS region as an etch barrier. Through this process, the liner nitride layer 14 of the PMOS region may be selectively removed.

Referring to FIG. 1D, an insulation layer 17 is formed over the resultant structure and a planarization process is performed until a surface of the pad nitride layer 12 is exposed. As a result, a plurality of isolation layers including the insulation layer 17 in the cell region and the peripheral region are formed.

Subsequently, the pad nitride layer 12 and the pad oxide layer 11 are removed, and a surface of the substrate 10 is exposed to thereby complete the formation of an STI structure. The liner oxide layer, the liner nitride layer and the insulation layer 17 may be partly removed in the course of removing the pad nitride layer 12 and the pad oxide layer 11. Referring to FIG. 1D, the liner oxide layer a portion of which is removed is denoted with a reference numeral '15A,' and the liner nitride layer a portion of which is removed is denoted with a reference numeral '14A.'

However, according to the conventional technology described above, since the liner nitride layer 14 is formed both in the cell region and the peripheral region, a few problems occur in the course of removing the liner nitride layer 14 of the PMOS region.

First, it is not easy to coat and remove a photoresist. As described before with reference to FIG. 1B, the substrate with the trenches for device isolation for forming the photoresist pattern 16 opening the PMOS region is coated with the photoresist. Since the photoresist is applied to the intermediate structure with a step in height, the photoresist may not be applied smoothly, and the adhesion of the photoresist may be low. Also, when the photoresist is removed, it may not be completely removed due to the step in height and thus residues may remain.

Second, the above described fabrication process is complicated, to and its manufacturing costs are rather high. As described before with reference to FIG. 1C, after the liner oxide layer 15 is removed, the photoresist pattern 16 should be removed. The photoresist removing process is generally performed through a photoresist (PR) strip process. Also, the liner nitride layer 14 is removed through a wet dip-out process using phosphate. In short, the conventional technology raises concerns that the fabrication process is rather complicated because the liner nitride layer 14 formed in the PMOS region is selectively removed and the manufacturing costs are high.

SUMMARY OF THE INVENTION

An exemplary embodiment of the present invention is directed to a semiconductor device including a liner nitride layer selectively formed in the area other than a PMOS region and a method for fabricating the same.

In accordance with one embodiment of the present invention, a method for fabricating a semiconductor device includes: providing a substrate; forming a plurality of trenches by etching the substrate; forming a first isolation layer by filling the plurality of the trenches with a first insulation layer; recessing the first insulation layer filling a first group of the plurality of the trenches to a predetermined depth; forming a liner layer over the first group of the trenches with the first insulation layer recessed to the predetermined depth; and forming a second isolation layer by filling the first group of the trenches, where the liner layer is formed, with a second insulation layer.

In accordance with another embodiment of the present invention, a method for fabricating a semiconductor device includes: providing a substrate; forming a plurality of trenches by etching the substrate including a cell region, an NMOS region, and a PMOS region; forming a first isolation layer in the PMOS region by filling the plurality of the trenches with a first insulation layer; forming a photoresist pattern covering the PMOS region over the substrate with the first insulation layer formed therein; recessing the first insulation layer filling a first group of the plurality of the trenches disposed in the cell region and the NMOS region to a predetermined depth by using the photoresist pattern as an etch barrier; forming a liner layer over the substrate with the first insulation layer recessed to the predetermined depth; forming a second insulation layer over the substrate with the liner layer formed therein; and forming a second isolation layer disposed in the cell region and the NMOS region by performing a planarization process until a surface of the substrate is exposed.

In accordance with yet another embodiment of the present invention, a semiconductor device having a plurality of isolation layers disposed in a cell region, an NMOS region, or a PMOS region, includes: a first isolation layer including a first insulation layer; and a second isolation layer including the first insulation layer, a second insulation layer, and a liner layer interposed between the first insulation layer and the second insulation layer.

DESCRIPTION OF SPECIFIC EMBODIMENTS

Figure 1A:
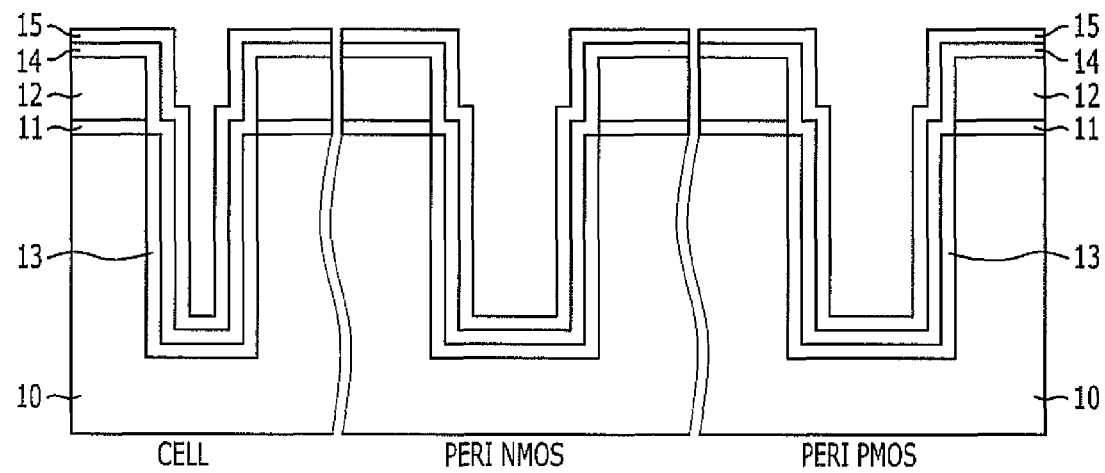
FIGS. 1A to 1D are cross-sectional views illustrating a conventional method for forming an isolation layer of a semiconductor device.
Figure 1B:
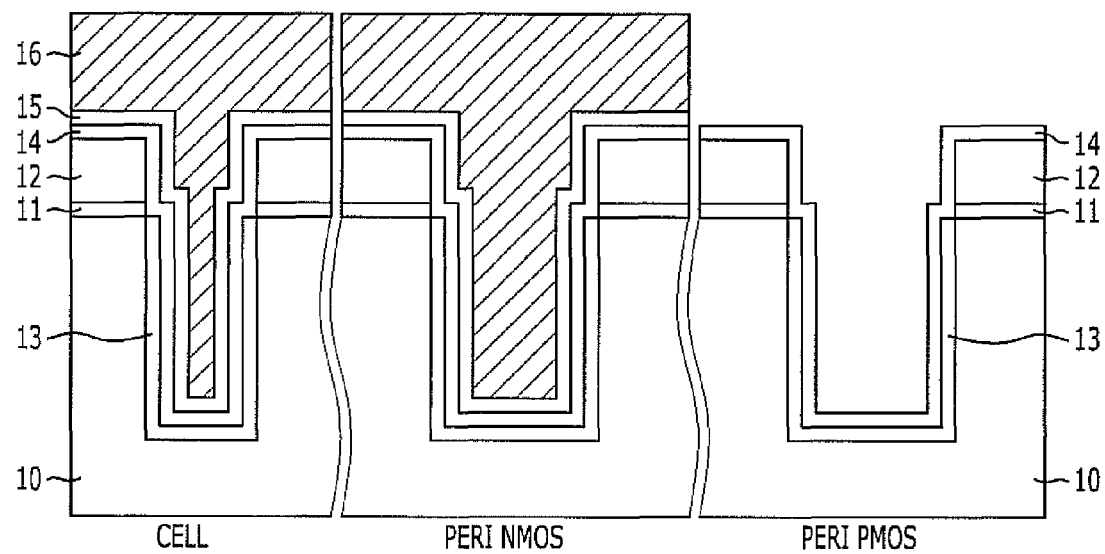
Figure 1C:
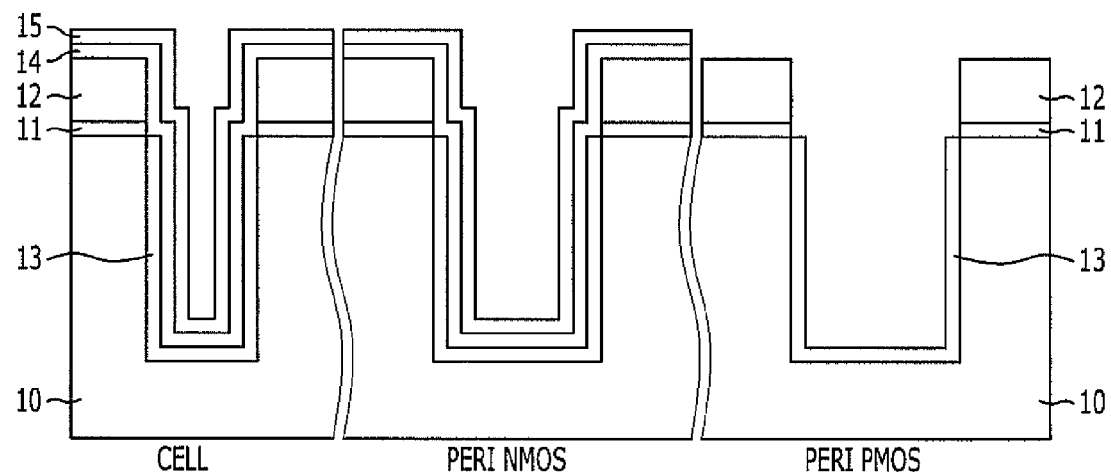
Figure 1D:
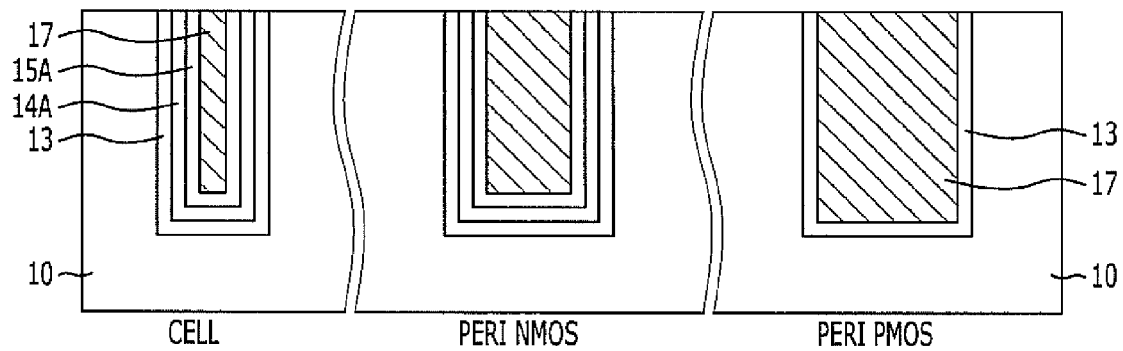

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on, or over, the second layer or the substrate, but also a case where a third layer exists between the first layer and the second layer or the substrate.

FIGS. 2A to 2D are cross-sectional views illustrating a method for forming an isolation layer of a semiconductor device in accordance with an embodiment of the present invention.

Figure 2A:
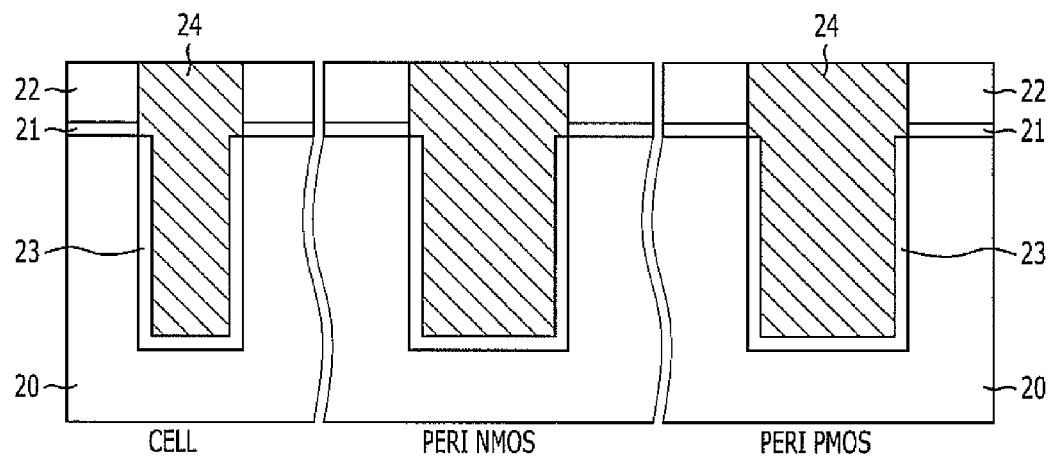
FIGS. 2A to 2D are cross-sectional views illustrating a method for forming an isolation layer of a semiconductor device in accordance with an embodiment of the present invention.

Referring to FIG. 2A, a substrate 20 including a cell region CELL and a peripheral region PERI (for example, PERI NMOS AND PERI PMOS) is provided. The peripheral region includes a PMOS region PERI PMOS, where a PMOS transistor is formed through a subsequent process, and an NMOS region PERI NMOS, where an NMOS transistor is formed through a subsequent process.

Subsequently, after a pad oxide layer 21 and a pad nitride layer 22 are sequentially formed over the substrate 20 including the NMOS region and the PMOS region, the pad nitride layer 22 and the pad oxide layer 21 are etched, and the substrate 20 is also etched to a predetermined depth to form a plurality of trenches for device isolation. The depth of the trenches for device isolation may range from approximately 2,000 Å to approximately 10,000 Å, although other ranges are contemplated.

Subsequently, an oxidation process is performed to cure the damage on the substrate acquired during the etch process for forming the trenches for device isolation. Through the oxidation process, a sidewall oxide layer 23 is formed on the surface of the substrate 20, exposed on the internal wall and on the bottom of the plurality of the trenches, for device isolation. The thickness of the sidewall oxide layer 23 may range from approximately 40 Å to approximately 100 Å, although other ranges are contemplated.

Subsequently, a first insulation layer 24 is formed over the substrate 20 with the sidewall oxide layer 23 formed therein. The first insulation layer 24 may include a liquid oxide layer, such as a Spin On Dielectric (SOD) layer or a perhydro-polysilazane (PSZ)-based oxide layer.

Subsequently, a planarization process is performed until a surface of the pad nitride layer 22 is exposed. Through the planarization process, the plurality of the trenches for device isolation are filled with the first insulation layer 24. The trenches for device isolation disposed in the PMOS region are filled with the first insulation layer 24 to form a first isolation layer in the PMOS region.

Figure 2B:
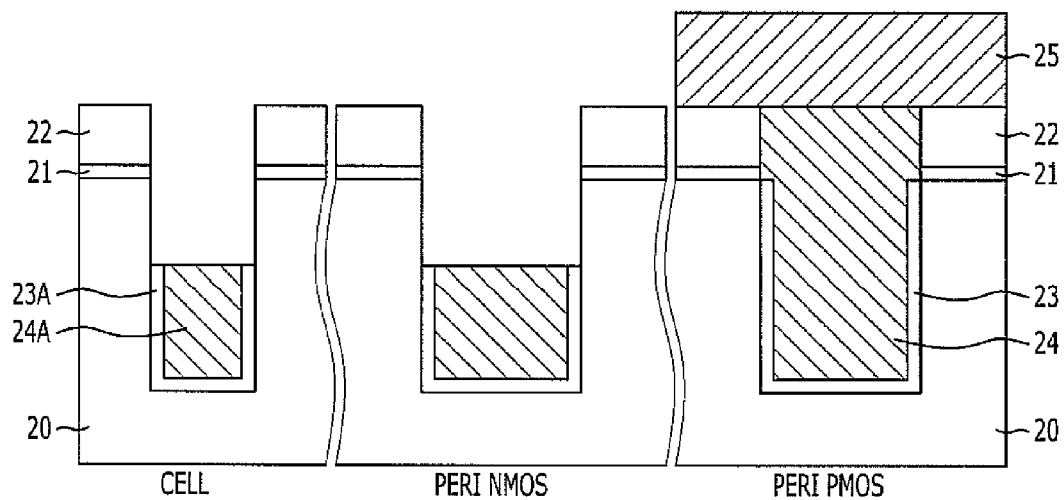

Referring to FIG. 2B, a photoresist is applied to the substrate 20 with the first isolation layer 24. When the planarized substrate is coated with the photoresist, there is no step height on the surface and thus the photoresist may be applied easily. Also, it is possible to prevent the adhesion of the photoresist from being deteriorated due to the presence of step height.

Subsequently, a photoresist pattern 25 is formed to open the cell region and the NMOS region, while covering the PMOS region through an exposure and development process. The photoresist pattern 25 is formed to cover the area except some trenches where the first insulation layer 24 are to be recessed to a predetermined depth for device isolation. For example, the photoresist pattern 25 is formed with openings for areas where a liner layer is to be formed inside the trenches for device isolation, while covering an area where the liner layer inside the trenches is not to be formed.

Subsequently, the first insulation layer 24 filling the trenches for device isolation disposed in the cell region and the NMOS region is etched to a predetermined depth using the photoresist pattern 25 as an etch barrier. Since the first insulation layer 24 is recessed using the photoresist pattern 25 as an etch barrier, it is possible to selectively recess the first insulation layer 24 filling some trenches for device isolation to a predetermined depth. Referring to FIG. 2B, the recessed first insulation layer is denoted with a reference numeral '24A,' and is referred to as "first insulation layer pattern 24A."

The recessed thickness of the first insulation layer 24 may range from approximately from 100 Å to approximately 1,200 Å, although other ranges are contemplated. The first insulation layer 24 formed in the PMOS region is protected by the photoresist pattern 25, and is not recessed.

During the process of recessing the first insulation layer 24, a portion of the sidewall oxide layer 23, which was formed on the internal wall of the trenches for device isolation, may also be removed. Referring to FIG. 2B, the sidewall oxide layer 23, a portion of which is removed, is denoted with a reference numeral '23A' and referred to as "a sidewall oxide layer pattern 23A." Also, although FIG. 2B illustrates removal of the sidewall oxide layer pattern 23A to the same recessed depth of the first insulation layer 24 and the internal wall of the trenches for device isolation are exposed to the recessed depth, the sidewall oxide layer pattern 23A may actually remain on the internal wall of the trenches for device isolation.

Figure 2C:
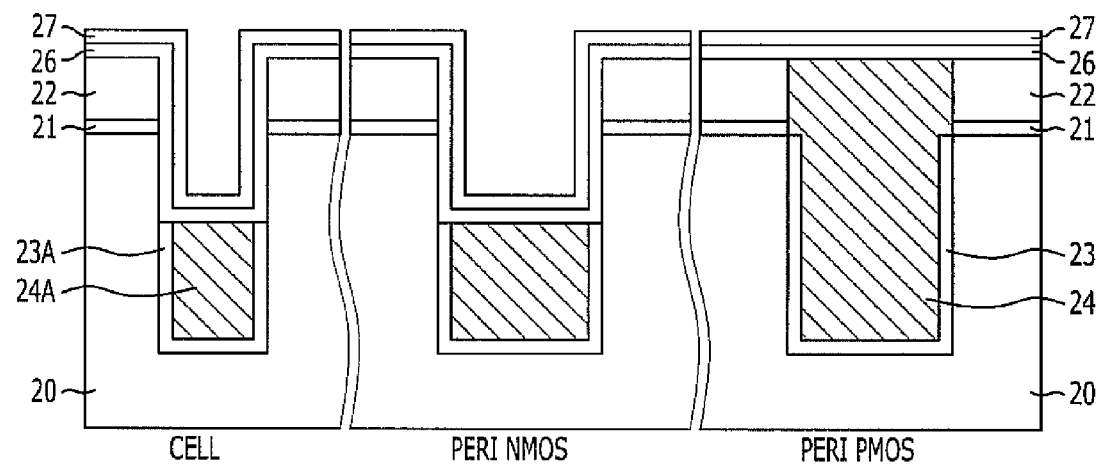

Referring to FIG. 2C, the photoresist pattern 25 is removed. Herein, since the photoresist pattern 25 is formed over a planar surface without step height, the photoresist pattern 25 may be easily removed without leaving residues behind.

Subsequently, liner layers 26 and 27 are formed over the resultant structure. For example, a liner oxide layer 26 is formed over the resultant structure, and then a liner nitride layer 27 may be formed over the resultant structure with the liner oxide layer 26. In this case, the liner oxide layer 26 is formed on the exposed internal wall of the trench where a portion of the sidewall oxide layer 23 has been removed.

The liner layers 26 and 27 are formed both in the cell region and the peripheral region. While the liner layers 26 and 27 are formed over the trenches acquired by recessing the first insulation layer 24 to a predetermined depth in the cell region and the NMOS region, the liner layers 26 and 27 are also formed over the pad nitride layer 22 and the first insulation layer 24 in the PMOS region. In other words, whereas the liner layers 26 and 27 are formed in the trenches for device isolation in the cell region and the NMOS region, the liner layers 26 and 27 are not formed in the trenches for device isolation in the PMOS region. Since the liner layers 26 and 27 formed over the pad nitride layer 22 and the first insulation layer 24 in the PMOS region are removed in a subsequent planarization process, the liner layers 26 and 27 remain only in the cell region and the NMOS region. The liner oxide layer 26 may have a thickness ranging from approximately 20 Å to approximately 200 Å (although other ranges are contemplated), and the liner nitride layer 26 may have a thickness ranging from approximately 30 Å to approximately 200 Å, although other ranges are contemplated.

Figure 2D:
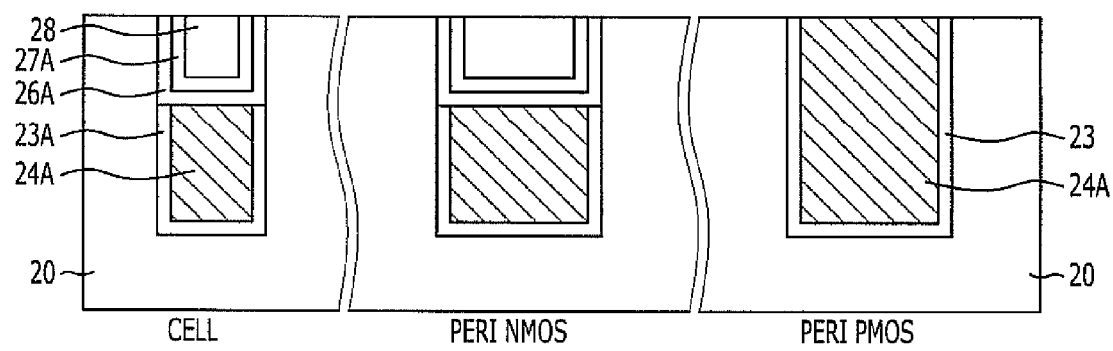

Referring to FIG. 2D, a second insulation layer 28 is formed over the resultant structure with the liner layers 26 and 27. The second insulation layer 28 may include an insulation layer having a relatively high density compared with the first insulation layer 24. For example, the second insulation layer 28 may include a high-density plasma (HDP) oxide layer or a tetra ethyl ortho silicate (TEOS) layer. The second insulation layer 28 may have a thickness ranging from approximately 4,000 Å to approximately 15,000 Å, although other ranges are contemplated.

Subsequently, a planarization process is performed until the surface of the pad nitride layer 22 is exposed. The liner layers 26 and 27 formed over the pad nitride layer 22 in the PMOS region during the planarization process are polished. However, the liner layers 26 and 27 formed in the trenches for device isolation in the cell region and the NMOS region remain. In other words, the liner layers 26 and 27 formed in the PMOS region are all removed during the planarization process. Referring to FIG. 2D, the liner oxide layer polished during the planarization process is denoted with a reference numeral '26A' and referred to as "liner oxide layer 26A," and the liner nitride layer polished during the planarization process is denoted with a reference numeral '27A' and referred to as "liner nitride layer 27A."

As a result, the trenches for device isolation where the liner layers 26 and 27 are formed are filled with a second isolation layer 28, and thus a second isolation layer 28 over the first insulation layer pattern 24A formed in both the cell region and the NMOS region, the second insulation layer 28, the first insulation layer pattern 24A, the liner oxide layer 26A, and the liner nitride layer 27A interposed between the first insulation layer pattern 24A and the second insulation layer 28 is formed.

Subsequently, the surface of the substrate 20 is exposed by removing the pad nitride layer 22 and the pad oxide layer 21 to thereby complete an STI structure. A portion of the liner oxide layer 26A and the liner nitride layer 27A may be etched together, while the pad nitride layer 22 and the pad oxide layer 21 are etched.

According to the technology of the embodiment of the present invention described above, a semiconductor device having a plurality of isolation layers disposed in the cell region, the NMOS region, and the PMOS region includes a first isolation layer provided with the first insulation layer 24 and a second isolation layer provided with the first insulation layer pattern 24A, the second insulation layer 28, and the liner layers 26 and 27 interposed between the first insulation layer pattern 24A and the second insulation layer 28. In particular, the first isolation layer is formed in the PMOS region, and the second isolation layer is formed in the cell region and the NMOS region.

In the cell region and the NMOS region, the stress applied to the substrate 20 is reduced by interposing the liner layers 26 and 27 around the second isolation layer, and as a result, the impurities of the substrate 20 are prevented from transferring to the inside of the second isolation layer. Since the liner layers 26 and 27 are formed after the first insulation layer pattern 24A is formed, the liner layers 26 and 27 are formed only on the upper sidewall of the trenches for device isolation. However, since the stress applied to the substrate and the transfer of the impurities generally occurs in the upper portion of the trenches for device isolation, the liner layers 26 and 27 can perform their function properly.

In the PMOS region, it is possible to prevent the HEIP phenomenon, which may be caused by trapped charges, from occurring by not interposing the liner layers 26 and 27 around the first isolation layer. Also, the gap between lattices becomes widened by the stress applied to the substrate 20 and thus strained silicon effect where holes are easily transferred occurs. Therefore, the current characteristic is improved.

Besides, it is possible to form the liner layers 26 and 27 after selectively recessing the first insulation layer pattern 24A in the cell region and the NMOS region by using the photoresist pattern 25 formed in the PMOS region. In this way, the liner layers 26 and 27 are selectively formed only in the trenches for device isolation of the cell region and the NMOS region, while they are not formed in the trenches for device isolation of the PMOS region. Therefore, the fabrication process does not need to include a phosphate dip-output process for removing the liner layers 26 and 27 which otherwise would have been formed in the trenches for device isolation of the PMOS region, and accordingly the fabrication process is simplified and the manufacturing costs are reduced.

Furthermore, since the liner layers 26 and 27 are formed after the first insulation layer is formed, the height-width ratio of the trenches formed when the second insulation layer 28 of the second isolation layer is filled is decreased. As a result, a gap-fill characteristic is improved and the generation of voids can be prevented. Although the first isolation layer is formed of a single layer (for example, isolation layer 24A formed in PERI PMOS region in FIG. 2D) while the second isolation layer is formed of double layers (for example, isolation layers 24A and 28 formed in CELL region in FIG. 2D), the first isolation layer formed in the PMOS region is less damaged from the formation of a contact plug than those formed in the cell region and the NMOS region. Therefore, there is no problem in obtaining desired characteristics, although the first isolation layer is formed of the first insulation layer which is relatively less dense.

According to the technology of the present invention, a liner nitride layer may be selectively formed only in the trenches for device isolation of a cell region and an NMOS region of a semiconductor device and not in the PMOS region. Therefore, the fabrication process does not have to include an additional process of removing the liner nitride layer formed in the PMOS region. Accordingly, the fabrication process may be simplified and the manufacturing costs may be reduced.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   forming a plurality of trenches by etching a substrate;
   forming a first isolation layer by filling the plurality of the trenches with a first insulation layer;
   forming a photoresist pattern covering an area, except a first group of the plurality of the trenches, over the substrate having the first insulation layer formed therein:
   recessing the first insulation layer filling the first group of the trenches to a predetermined depth;
   forming a liner layer over the first group of the trenches with the first insulation layer recessed to the predetermined depth; and
   forming a second isolation layer by filling the first group of the trenches, where the liner layer is formed, with a second insulation layer.

2. The method of claim 1, further comprising:
   forming a sidewall oxide layer on an internal wall of the plurality of the trenches through an oxidation process after the forming of the plurality of the trenches.

3. The method of claim 1, wherein in the recessing of the first insulation layer to the predetermined depth,
   the first insulation layer filling the first group of the trenches is recessed to the predetermined depth by using the photoresist pattern as an etch barrier.

4. The method of claim 1, further comprising:
   removing the photoresist pattern after the recessing of the first insulation layer to the predetermined depth.

5. The method of claim 1, wherein the forming of the liner layer includes:
   forming a liner oxide layer over the substrate with the first insulation layer recessed to the predetermined depth; and
   forming a liner nitride layer over the substrate with the liner oxide layer formed therein.

6. The method of claim 1, wherein the forming of the second isolation layer includes:
   forming the second insulation layer over the substrate with the liner layer formed therein; and
   performing a planarization process to expose a surface of the substrate.

7. The method of claim 1, wherein the first isolation layer includes the first insulation layer and is disposed in a PMOS region, and the second isolation layer includes the first insulation layer recessed to the predetermined depth, the second insulation layer, and the liner layer interposed between the first insulation layer and the second insulation layer and is disposed in a cell region or an NMOS region.

8. A method for fabricating a semiconductor device, comprising:
   forming a plurality of trenches by etching a substrate including a cell region, an NMOS region, and a PMOS region;
   forming a first isolation layer in the PMOS region by filling the plurality of the trenches with a first insulation layer;
   forming a photoresist pattern covering the PMOS region over the substrate with the first insulation layer formed therein;
   recessing the first insulation layer filling a first group of the plurality of the trenches disposed in the cell region and the NMOS region to a predetermined depth by using the photoresist pattern as an etch barrier;
   forming a liner layer over the substrate with the first insulation layer recessed to the predetermined depth;
   forming a second insulation layer over the substrate with the liner layer formed therein; and
   forming a second isolation layer disposed in the cell region and the NMOS region by performing a planarization process until a surface of the substrate is exposed.

9. The method of claim 8, further comprising:
   forming a sidewall oxide layer on an internal wall of the plurality of the trenches through an oxidation process after the forming of the plurality of the trenches.

* * * * *